United States Patent [19]
Nozawa et al.

[11] Patent Number: 5,459,423
[45] Date of Patent: Oct. 17, 1995

[54] SEMICONDUCTOR INTEGRATED CIRCUIT FOR A STABLE CONSTANT DELAY TIME

[75] Inventors: Yasumitsu Nozawa, Yokohama; Shigeto Mizukami, Kawasaki; Makoto Segawa, Yokohama, all of Japan

[73] Assignee: Kabushiki Kaisha Toshiba, Kawasaki, Japan

[21] Appl. No.: 77,737

[22] Filed: Jun. 18, 1993

[30] Foreign Application Priority Data

Jun. 18, 1992 [JP] Japan .................... 4-159587

[51] Int. Cl.$^6$ ........................... H03K 5/153; H03K 5/159
[52] U.S. Cl. .................. 327/277; 327/281; 327/541; 327/525
[58] Field of Search ........................ 307/605, 606, 307/601, 603 V, 296.1, 602, 296.2, 595, 597, 296.6, 600, 606; 365/194, 228

[56] References Cited

U.S. PATENT DOCUMENTS

| | | | |
|---|---|---|---|
| 4,315,295 | 2/1982 | Zocholl | 307/603 |
| 4,494,021 | 1/1985 | Bell et al. | 307/601 |
| 4,788,462 | 11/1988 | Vesce et al. | 307/601 |
| 4,803,663 | 2/1989 | Miyamoto et al. | 365/194 |
| 4,845,390 | 7/1989 | Chan | 307/606 |
| 5,051,630 | 9/1991 | Kogan et al. | 307/603 |

Primary Examiner—Timothy P. Callahan
Assistant Examiner—My-Trang Nu Ton
Attorney, Agent, or Firm—Foley & Lardner

[57] ABSTRACT

A delay circuit is interposed between first and second circuit systems both driven by a first supply voltage. The delay circuit delays a signal applied by the first circuit system, and then transmits the delayed signal to the second circuit system. In particular, a constant voltage supply circuit generates a second supply voltage (constant voltage) on the basis of the first supply voltage, and supplies the constant voltage to this delay circuit, so that a stable constant delay time can be obtained by the delay circuit without being subjected to the influence of fluctuations of the first supply voltage. All the circuit elements are formed on the same semiconductor substrate. Further, it is preferable to construct the constant voltage supply circuit in such a way that the output voltage thereof is programmable.

4 Claims, 6 Drawing Sheets

FIG. I PRIOR ART

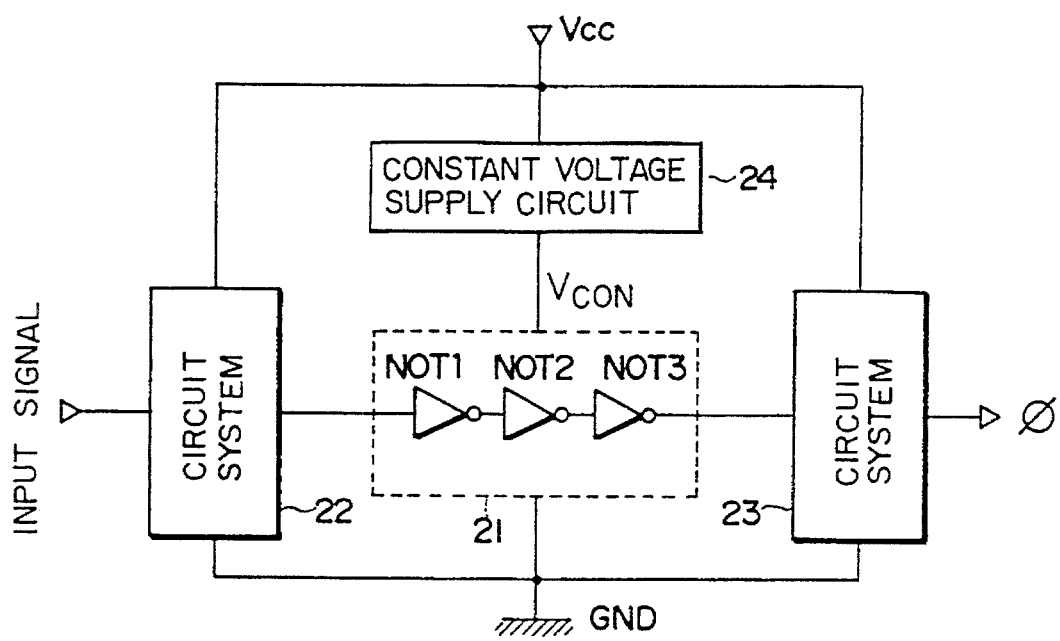
F I G. 2
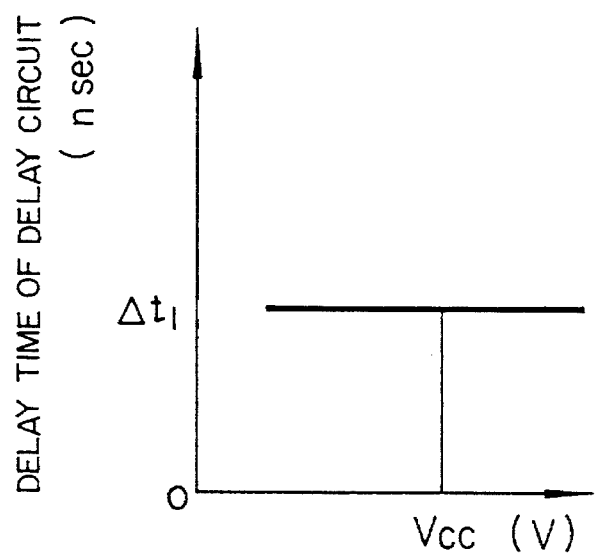
F I G. 3

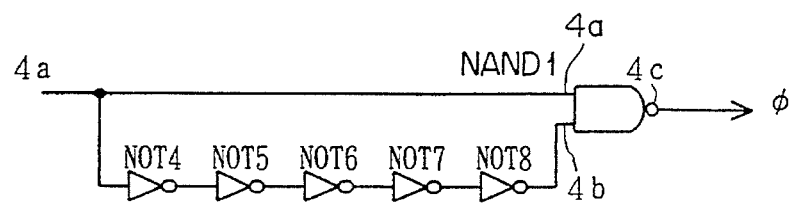
FIG. 4
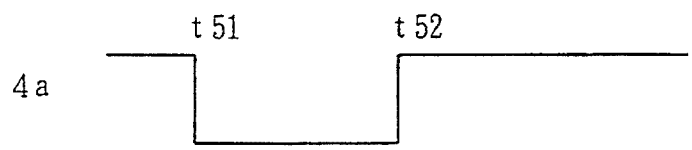
FIG. 5A
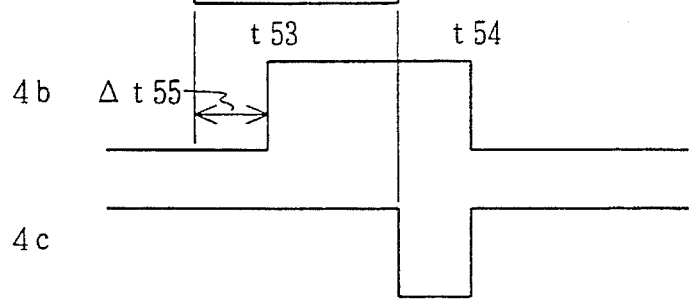
FIG. 5B
FIG. 5C

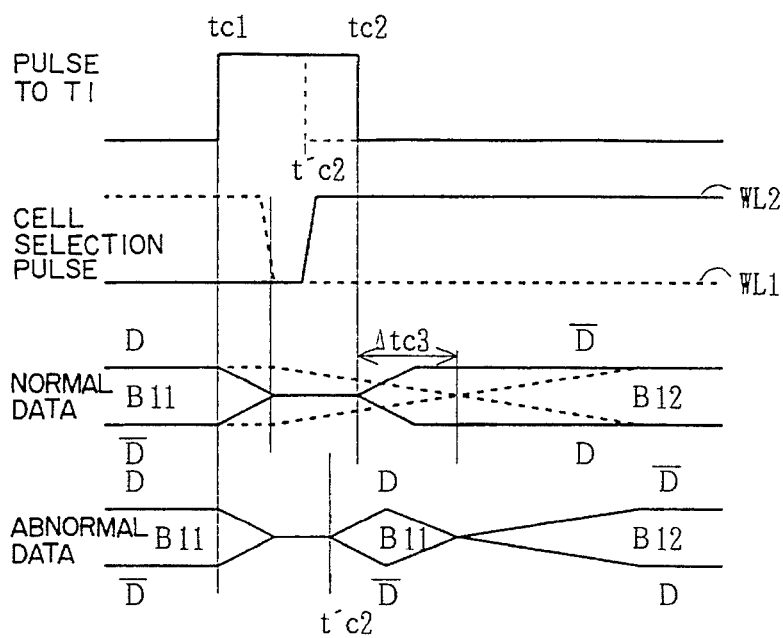
FIG. 9A PULSE TO TI
FIG. 9B CELL SELECTION PULSE
FIG. 9C NORMAL DATA
FIG. 9D ABNORMAL DATA

SEMICONDUCTOR INTEGRATED CIRCUIT FOR A STABLE CONSTANT DELAY TIME

BACKGROUND OF THE INVENTION

The present invention relates to a semiconductor integrated circuit, and more specifically to a delay circuit thereof.

In conventional semiconductor integrated circuits, a delay circuit is interposed between two circuit systems so as to adjust timings, for instance. The delay circuit as described above is usually composed of logic gates for generating pulse signals or timings between two signals and activated on the basis of a single supply voltage.

In the conventional delay circuit, however, in case the supply voltage fluctuates, since the charge and/or discharge time of parasitic capacitances of the logic gates fluctuates, there exists a problem in that the delay time also fluctuates, as shown in FIG. 1. In the case of a SRAM (static RAM), for instance, a delay circuit is used to apply an equalize pulse after the potential level of a word line has risen. In this case, if the supply voltage becomes high, since the charge and/or discharge is completed at high speed in the respective logic gates, the potential level of the equalize pulse of the SRAM falls earlier than a predetermined timing, with the result that the equalize pulse falls in level before the potential level status of the word line is not yet changed, thus causing an erroneous operation.

SUMMARY OF THE INVENTION

Accordingly, the object of the present invention is to provide a semiconductor integrated circuit which can operates stably without being subjected to the influence of supply voltage fluctuations.

According to the present invention, a delay circuit is interposed between first and second circuit systems both driven by a first supply voltage. The delay circuit delays a signal applied by the first circuit system, and then transmits the delayed signal to the second circuit system. In the present invention, in particular a constant voltage supply circuit generates a second supply voltage (constant voltage) on the basis of the first supply voltage, and supplies this generated constant supply voltage to this delay circuit, so that a stable constant delay time can be obtained by the delay circuit without being subjected to the influence of fluctuations of the first supply voltage. All the circuit elements are formed on the same semiconductor substrate. Further, it is preferable to construct the constant voltage supply circuit in such a way that the output voltage thereof is programmable.

BRIEF DESCRIPTION OF THE DRAWINGS

In the attached drawings:

FIG. 2 is a circuit diagram showing one embodiment of the semiconductor integrated circuit including a delay circuit according to the present invention;

FIG. 3 is a graphical representation showing the relationship between the constant supply voltage (Vcc) and the delay time in a delay circuit shown in FIG. 2;

FIG. 4 is a circuit diagram showing another example of the delay circuit according to the present invention;

FIG. 5A to 5C are timing charts for assistance in explaining the operation of the delay circuit shown in FIG. 4;

FIGS. 9A to 9D are timing charts for assistance in explaining the operation of the SRAM shown in FIG. 8.

DETAILED DESCRIPTION OF THE PREFERRED EMBODIMENTS

Figure 1:
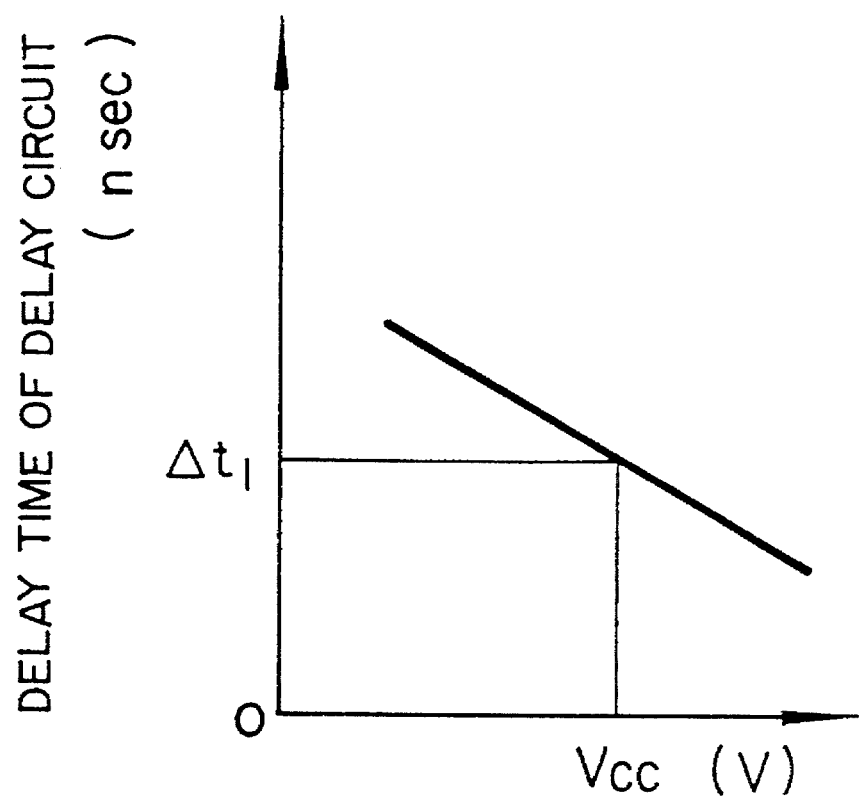
FIG. 1 is a graphical representation showing the relationship between the supply voltage (Vcc) fluctuation and the delay time in a delay circuit.

The embodiment of the present invention will be described hereinbelow with reference to the attached drawings. FIG. 2 shows a circuit configuration of an embodiment of the semiconductor integrated circuit according to the present invention. In FIG. 2, an input signal is applied to a first circuit system 22. An output of the first circuit system 22 is given to a second circuit system 23 via a delay circuit 21. An output signal $\Phi$ is outputted from the second circuit system 23. A supply voltage Vcc is supplied to the first and second circuit systems 22 and 23 and further a constant voltage supply circuit 24, respectively. The constant voltage supply circuit 24 generates a constant voltage Vcon on the basis of the supply voltage Vcc. The constant voltage Vcon of the constant voltage supply circuit 24 is supplied to the delay circuit 21. Therefore, since the delay circuit 21 is activated on the basis of the constant voltage Vcon, the delay time of the delay circuit 21 can be kept constant, without being subjected to the influence of the fluctuations of the supply voltage Vcc, as shown in FIG. 3. In this embodiment shown in FIG. 2, the delay circuit 21 is composed of three series-connected inverters NOT1, NOT2 and NOT3.

FIG. 4 shows another example of the delay circuit. In this delay circuit, an input signal In is directly applied to one input terminal 4a of a NAND gate NAND1 and to the other input terminal 4b of thereof via a five-stage inverter train composed of NOT4 to NOT8 after being delayed through these inverters NOT4 to 8.

The operation of the delay circuit shown in FIG. 4 will be described hereinbelow with reference to FIGS. 5A to 5C.

Now, when a pulse of an "L" level (logical "0" level) with a time width (from t52 to t51) is inputted to the node 4a of the delay circuit, the pulse at the node 4a is directly inputted to one input terminal 4a of the NAND gate NAND1, and further to the other input terminal 4b of the NAND gate NAND1 after having been inverted and further delayed by a delay time Δt55 through the delay circuit composed of five inverters NOT4 to NOT8. Accordingly, both input terminals of the NAND gate NAND1 change to an "H" level at timing t52, and this status is kept until timing t54, so that a pulse $\Phi$ of the "L" level with a time width (t54 to t52) is outputted to an output node 4c.

Figure 6:
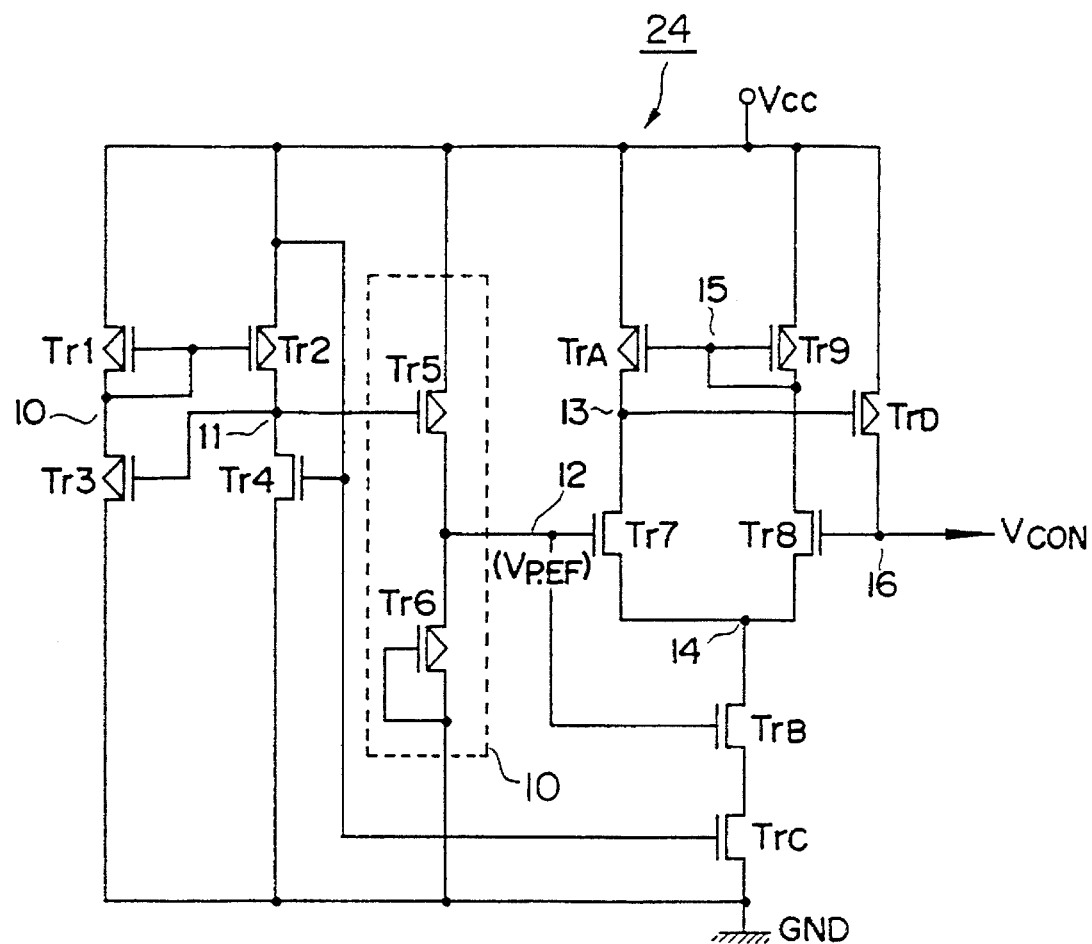
FIG. 6 is a circuit diagram showing one embodiment of a constant voltage supply circuit shown in FIG. 2.

FIG. 6 is a circuit diagram showing an example of the constant voltage supply circuit 24 shown in FIG. 2.

In FIG. 6, Tr1 to Tr3 are pMOS transistors for forming a current mirror circuit. The source of the transistor Tr1 is connected to a high potential side supply voltage Vcc. Both the gate and the drain of the transistor Tr1 are shorted into a diode connection. The source of the transistor Tr2 is connected to a high potential side supply voltage Vcc. The gate of the transistor Tr2 is connected to the gate and drain of the transistor Tr1, respectively. The gate of the transistor Tr3 is connected to the drain of the transistor Tr2. This junction point 11 between the gate of Tr3 and the drain of Tr2 is an input terminal Iref of the current mirror circuit. The source of the transistor Tr3 is connected to the gate and drain of the transistor Tr1. The source of the transistor Tr3 is an output terminal Iout of the current mirror circuit. The junction point between the drain of the transistor Tr2 and the gate of the transistor Tr3 is connected to the drain of a transistor Tr4. The source of this transistor Tr4 is connected to the ground voltage supply GND. The gate of the transistor Tr4 is connected to the high potential side supply voltage Vcc. This transistor Tr4 is a normally turned-on element whose turn-on status changes according to the supply voltage Vcc; in other words, the resistance between the source and the drain of the transistor Tr4 changes according to the supply voltage Vcc.

The potential at a node 10 of the junction point between the drain of the transistor Tr1 and the source of the transistor Tr3 can be determined on the basis of the ratio of the gate widths of the two transistors Tr1 and Tr2, so that the gate-source voltage $V_{GS}$ of the transistor Tr3 can be held at a constant voltage and therefore the transistor Tr3 is turned on under the condition that the source-drain resistance of the transistor Tr3 is kept at a constant level. Further, the potential at a node 11 of the common junction point between the two drains of the two transistors Tr2 and Tr4 can be determined by the resistance ratio of both the transistors TF2 and Tr4. Here, if the turn-on status (the resistance between the source and the drain) of the transistor Tr4 is constant, the potential at the node 11 of course fluctuates according to the supply voltage (Vcc) fluctuations. However, since the gate of the transistor Tr4 is connected to the supply voltage Vcc, the resistance between the source and the drain of the transistor Tr4 changes according to the supply voltage Vcc, so that it is possible to keep the potential of the node 11 at a constant level. In other words, when the turn-on status of the transistor Tr4 is kept constant, the potential at the node 11 increases with increasing supply voltage Vcc, and decreased with decreasing supply voltage Vcc. However, when the supply voltage Vcc becomes high, since the resistance between the source and drain of the transistor Tr4 decreases, the potential at the node 11 will not increases. On the other hand, when the supply voltage Vcc becomes low, since the resistance between the source and drain of the transistor Tr4 increases, the potential at the node 11 will not decreases, with the result that the potential at the node 11 can be kept at a constant potential level, without being subjected to the influence of the supply voltage (Vcc) fluctuations.

In FIG. 6, Tr5 and Tr6 are pMOS transistors for forming an active voltage dividing circuit. The source of the transistor Tr5 is connected to a high potential side supply voltage Vcc, and the gate thereof is connected to the node 11. Therefore, the transistor Tr5 is activated on the basis of the gate voltage at the node 11. The drain of the transistor Tr5 is connected to the source of the transistor Tr6, and the gate and the drain of the transistor Tr6 are shorted and further connected to the ground supply voltage GND. The potential at the node 12 of the junction point between the drain of the transistor Tr5 and the source of the transistor Tr6 is determined by the ratio of the turn-on resistances of the two transistors Tr5 and Tr6. The resistance between the source and the drain of the transistor Tr5 is determined on the basis of the constant potential at the node 11. Therefore, current proportional to the voltage Vcc flows through the transistor Tr5, so that a voltage drops across the transistor Tr5 in proportion to the voltage Vcc, thus the potential at the node 12 being determined to be constant.

In FIG. 6, Tr7 and Tr8 are nMOS transistors for forming a differential pair. The potential at the node 12 is applied to the gate of the transistor Tr7 as a reference voltage Vref. Tr9 and TrA are pMOS transistors for forming a current mirror circuit. The sources of the two transistors Tr9 and TrA are connected to the high potential side supply voltage Vcc. The gate and the drain of the transistor Tr9 are shorted so as to form an input terminal Iref of the current mirror circuit. The gate of the transistor TrA is connected to the gate and the drain of the transistor Tr9, and the drain of the transistor TrA forms an output terminal Iout of the current circuit. The drains of these transistors Tr9 and TrA are connected to the drains of two transistors Tr8 and Tr7, respectively. The current mirror circuit Tr9 and TrA form an active load of the differential pair Tr7 and Tr8.

The common connection point between the two sources of the two transistors Tr7 and Tr8 is connected to the drain of an nMOS TrB. The gate of the transistor TrB is connected to the node 12 so as to be driven by the constant reference voltage Vref. The source of the transistor TrB is connected to the drain of an nMOS transistor TrC. The gate of the transistor TrC is connected to the high potential side supply voltage Vcc and the source thereof is connected to the ground supply voltage GND. Therefore, the resistance between the drain and the source of the transistor TrC changes according to the supply voltage Vcc, so that the potential between the high potential side supply voltage Vcc and the source of the transistor TrB is kept constant without being subjected to the fluctuations of the high potential side supply voltage Vcc. That is, the potential at the node 14 (the common connection between the sources of the differential pair Tr7 and Tr8) and the potential at the node 15 (the connection point between the gate and the drain of the transistor Tr9) are both determined by the ratios of the resistances of the three transistors Tr9, Tr8 and TrB, respectively. Accordingly, the potential at the node 13 (the connection point between the drain of the transistor TrA and the drain of the transistor Tr7) can be kept at a constant potential. To this node 13, the gate of a pMOS transistor TrD is connected. The source of the transistor TrD is connected to the high potential side supply voltage Vcc and the drain thereof is connected to the gate of the transistor Tr8. Here, the resistance between the source and the drain of the transistor TrD is determined on the basis of the potential at the node 13. Therefore, current proportional to the voltage Vcc flows through the transistor TrD, so that a voltage drops across the transistor TrD in proportion to the supply voltage Vcc. Consequently, the potential at the node 16 of the connection point between the drain of the transistor TrD and the gate of the transistor Tr8 is kept at a constant potential, and outputted as an output voltage Vcon of the constant voltage supply circuit 24.

Here, although this output voltage Vcon can be determined by the reference voltage Vref, this reference voltage Vref can be adjusted by setting the ratio of the gate width of the two transistors Tr5 and Tr6 for constituting the voltage dividing circuit 10.

Figure 7:
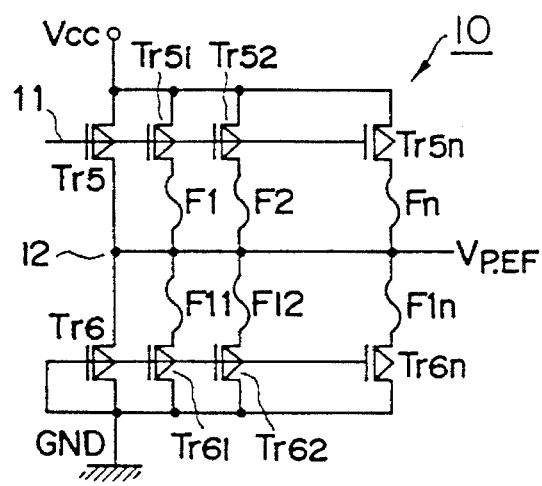
FIG. 7 is a detailed circuit diagram showing a programmable portion applied to a part of the constant voltage supply circuit shown in FIG. 6.

The voltage dividing circuit 10 can be preferably constructed so as to be programmable, as shown in FIG. 7. In the drawing, a plurality of pMOS transistors Tr51, . . . , Tr5n are connected between the high potential side supply voltage Vcc and the node 12 in parallel to the transistor Tr5 via fuses F1, F2, . . . , Fn, respectively. In the same way, a plurality of pMOS transistors Tr61, . . . , Tr6n are connected between the node 12 and the ground supply voltage GND in parallel to the transistor Tr6 via fuses F11, F12, . . . , F1n, respectively. Therefore, it is possible to adjust the ratio (W5/W6)

(where W5 denotes the total gate width on the Tr5 side, and W6 denotes the total gate width on the Tr6 side) by selectively cutting off the fuses F1, F2, ..., Fn and F11, F12, ..., F1n. Therefore, any required reference voltage Vref can be obtained in proportion to the gate width ratio (W5/W6).

Figure 8:
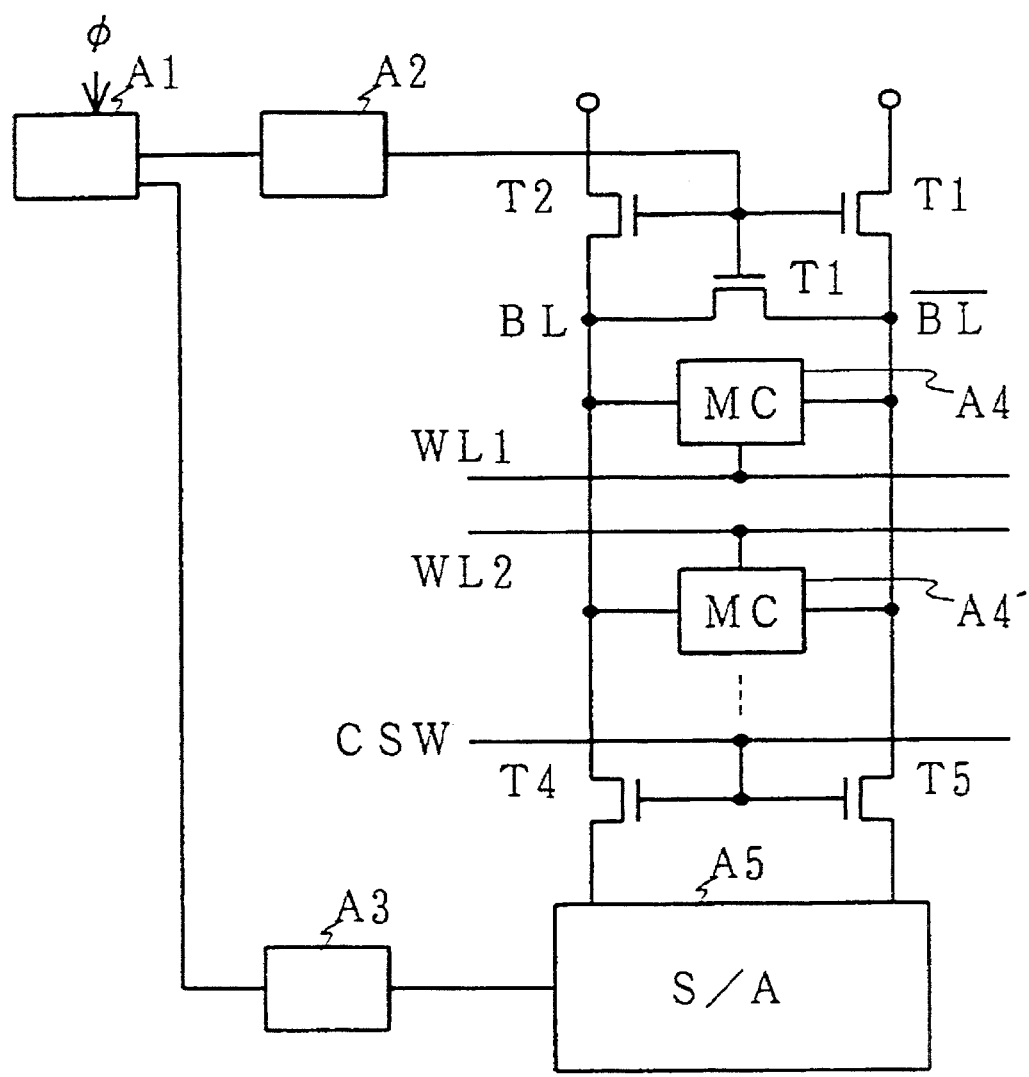
FIG. 8 is a circuit diagram showing an essential portion of the SRAM to which the present invention is applied.

FIG. 8 is a block diagram showing an example of the present invention applied to a SRAM (static RAM). In the drawing, the SRAM is composed of a pulse generating and delay circuit A1; a bit line activating circuit A2; a sense amplifier activating circuit A3; memory cells A4, A4', ... ; a sense amplifier AS; bit lines BL and /BL; word lines WL1 and WL2; and a column select line CSL. A plurality of cells A4, A4', ... are arranged between two common bit lines BL and /BL. The sense amplifier A5 is connected to these cells A4, A4', ... through these bit lines BL and /BL in such a way that data stored in the selected cell of the cells A4, A4', ... can be sensed by the sense amplifier AS. Further, an equalize transistor T1 turned on or off in response to an equalize pulse is connected between the two bit lines BL and /BL.

In general, when the equalize pulse with a predetermined time width is being applied to the equalize transistor T1, a pair of the bit lines of the cell array are kept at the same potential, so that the cells can be switched at high speed.

Here, the operation of when the word lines are switched from WL1 to WL2 as shown in FIG. 9B will be described hereinbelow, under the condition that the two cells A4 and A4' store two complementary data, respectively.

In this case, as shown in FIG. 9A, the equalize pulse is allowed to rise at timing tc1 before the word lines are switched; that is, the select signal WL1 of the cell A4 is allowed to fall. Then, the equalize transistor T1 is turned on to short the two bit lines BL and /BL, so that the two bit lines are set to the same intermediate potential, as shown by the solid line in FIG. 9C. Thereafter, the equalize pulse is allowed to be fall at timing tc2, after the word line WL1 is switched to the word line WL2 in potential level and further the high level of the equalize pulse is kept for a predetermined time. Then, the transistor T1 is turned off, so that the potential levels of the bit lines BL and /BL are determined by the data level of the cell A4'.

Under the control as described above, the potential levels of bit lines BL and /BL change as shown by the solid lines in FIG. 9C. In contrast with this, when not controlled by the equalize pulse, since the bit lines BL and /BL are triggered by only the switching operation of the word lines, the potentials level of the two bit lines BL and /BL change as shown by dashed lines in FIG. 9C. FIG. 9C indicates that when controlled by the equalize pulse, it is possible to read data stored in the cell A4' by a time tc3 earlier than would be the case when not controlled by the equalize pulse.

In other words, in the case of the conventional SRAM, as shown in FIG. 9D, when the supply voltage Vcc rises, since the charge and discharge operation are effected at higher speed, the timing at which the equalize pulse of the SRAM falls becomes earlier than the timing tc2, as shown by timing tc2' in FIG. 9A for instance. In this case, since the equalize pulse falls before the potential levels of the word lines WL1 and WL2 change perfectly, the data stored in the cell A4 is once read by the bit lines BL and/BL and thereafter the data stored in the cell A4' is read by the bit lines BL and /BL, thus causing an erroneous operation and thereby deteriorating the reliability of the high speed data operation.

As described above, in the case where the conventional SRAM is controlled by the equalize pulse, if the supply voltage Vcc fluctuates, the equalize pulse is not delayed sufficiently and therefore the equalize pulse width is not sufficient, with the result that an erroneous operation may occur. In contrast with this, in the case where the delay circuit according to the present invention is applied to the SRAM, it is possible to stably read and write data from and in the memory cells, because the operation of the pulse generating circuit is not subjected to the influence of the fluctuations of the supply voltage Vcc.

Without being limited to only the equalize pulse generating circuit of the SRAM, the semiconductor integrated circuit according to the present invention can be applied to other pulse generating circuits for generating an activating signal, a write recovery signal, etc. of the internal synchronous SRAM, for instance.

What is claimed is:

1. A semiconductor integrated circuit, comprising:

a first circuit system supplied with a first supply voltage, for receiving an input signal;

a delay circuit for delaying an output of said first circuit system;

a second circuit system supplied with the first supply voltage, for generating an output in response to the output of said delay circuit; and a constant voltage supply circuit, supplied with the first supply voltage, for supplying a constant voltage to said delay circuit, said delay circuit being supplied with only said constant voltage, said constant voltage supply circuit further including programmable means for determining a voltage value of said constant voltage, said constant voltage supply circuit being formed on a semiconductor substrate together with said first circuit system, said delay circuit and said second circuit system.

2. The semiconductor integrated circuit as claimed in claim 1, wherein said programmable means comprises a voltage dividing circuit for selectively dividing said first supply voltage.

3. The semiconductor integrated circuit as claimed in claim 2, wherein said voltage dividing circuit comprises:

a group of high potential side MOS transistors each having a source and a drain connected between a supply point of the first supply voltage and a voltage dividing point, respectively, so as to function as high potential side active resistance elements;

a group of low potential side MOS transistors each having a source and a drain connected between the voltage dividing point and a ground, respectively so as to function as low potential side active resistance elements;

a group of high potential side fuses each providing a connection between the voltage dividing point and a transistor of said high potential side MOS transistor group, said fuses selectively cutting off connections between the voltage dividing point and transistors of said high potential side MOS transistor group; and a group of low potential side fuses each providing a connection between the voltage dividing point and a transistor of said low potential side MOS transistor group, said fuses selectively cutting off connections between the voltage dividing point and transistors of said low potential side MOS transistor group.

4. The semiconductor integrated circuit as claimed in 2, which further comprises a differential amplifier for outputting an amplified output on the basis of a reference voltage outputted by said voltage dividing circuit.

* * * * *